United States Patent
Lin

[19]

[11] Patent Number: 6,141,220
[45] Date of Patent: Oct. 31, 2000

[54] CPU HEAT SINK MOUNTING ARRANGEMENT

[75] Inventor: Shih-jen Lin, Taipei, Taiwan

[73] Assignee: Global WIN Technology Co., Ltd., Taipei, Taiwan

[21] Appl. No.: 09/285,102

[22] Filed: Apr. 2, 1999

[51] Int. Cl.⁷ .................................................. H05K 7/20
[52] U.S. Cl. ........................ 361/704; 165/80.3; 165/185; 174/16.3; 257/719; 361/710; 361/719
[58] Field of Search ............................. 165/80.2, 80.3, 165/185; 174/16.3; 257/710–719, 726–727; 361/704, 707, 709–710, 715, 719–720

[56] References Cited

U.S. PATENT DOCUMENTS

| | | |
|---|---|---|
| 5,621,244 | 4/1997 | Lin .......................................... 257/718 |
| 5,662,163 | 9/1997 | Mira ........................................ 361/704 |
| 5,761,061 | 6/1998 | Hajjanzadeh et al. ................... 361/704 |
| 5,883,783 | 3/1999 | Tutturro .................................. 361/704 |
| 5,982,622 | 11/1999 | Chiou ..................................... 361/704 |

*Primary Examiner*—Gregory Thompson
*Attorney, Agent, or Firm*—Robert E. Bushnell, Esq.

[57] ABSTRACT

A CPU heat sink mounting arrangement, which includes a circuit board carrying a CPU at the top side, a heat sink attached to the CPU, a positioning plate attached to the circuit board at the bottom side, the positioning plate having four necked upright mounting rods inserted through respective through holes at the CPU and the heat sink, and two locking plates fastened to the upright mounting rods to lock the heat sink, the circuit board and the positioning plate together, wherein the locking plates each have two upwardly obliquely extended and slotted spring strips for fastening to the necked upright mounting rods.

20 Claims, 6 Drawing Sheets

CPU HEAT SINK MOUNTING ARRANGEMENT

BACKGROUND OF THE INVENTION

The present invention relates to a CPU heat sink mounting arrangement which comprises a circuit board, a positioning plate and a heat sink attached to the circuit board at two opposite sides, and two locking plates installed in the heat sink and fastened to upright rods at the positioning plate to secure the heat sink, the circuit board and the positioning plate together, enabling the heat sink to be maintained in close contact with a CPU at the circuit board.

When the CPU (Central Processing Unit), for example, PENTIUM II from Intel at the main board in a computer is operated, it produces much heat. It is well known that excessive high temperature affects normal operation of the CPU. Therefore, heat must be quickly carried away from the CPU during the operation of the computer. FIG. 8 shows a CPU heat sink mounting arrangement for this purpose. This design was intended by the present inventor, and is comprised of a heat sink, a circuit board carrying a CPU, two coupling plates, and two substantially L-shaped locking plates (only one locking plate is shown). The heat sink comprises four headed mounting rods respectively inserted through respective through holes at the circuit board and respective coupling holes at each of the coupling plates. The locking plates are respectively fastened to the headed mounting rods to lock the heat sink, the circuit board and the coupling plates together. The locking plates each have an elongated slot longitudinally extended to one end, and two keyway-like locating holes formed integral with the elongated slot for engagement with the head of each of the headed mounting rods of the heat sink. This structure of CPU heat sink mounting arrangement is functional, however it still has drawbacks. Because the coupling plates tend to be displaced, electronic components at the bottom side wall of the circuit board, if any, may be damaged by the coupling plates during transportation of the computer.

SUMMARY OF THE INVENTION

It is one object of the present invention to provide a CPU heat sink mounting arrangement which requires less installation space. It is another object of the present invention to provide a CPU heat sink mounting arrangement which can easily be installed. It is still another object of the present invention to provide a CPU heat sink mounting arrangement which is inexpensive to manufacture. According to one aspect of the present invention, the CPU heat sink mounting arrangement has a circuit board carrying a CPU at the top side, a heat sink attached to the CPU, a positioning plate attached to the circuit board at the bottom side, the positioning plate having four necked upright mounting rods inserted through respective through holes at the CPU and the heat sink, and two locking plates fastened to the upright mounting rods to lock the heat sink, the circuit board and the positioning plate together. According to another aspect of the present invention, the locking plates each have a locating means at one end, which is forced into engagement with the heat sink at one end of one of the sliding tracks, a finger strip at an opposite end for the holding of the hand, two spring strips obliquely upwardly raised from a top side wall thereof and spaced between the locating means and the finger strip, the spring strips each having a fixed end formed integral with the respective locking plate and a free end, two round holes respectively disposed at the fixed end of each of the spring strips which are aligned with two of the through holes at the heat sink for the insertion of the corresponding upright rods of the positioning plate when the locating means is fastened to the heat sink, and two elongated sliding slots respectively provided at the spring strips and extended from the round holes toward the free end of each of the spring strips for engagement with the neck at each of the corresponding upright mounting rods of the positioning plate.

DETAILED DESCRIPTION OF THE PREFERRED EMBODIMENT

Figure 1:
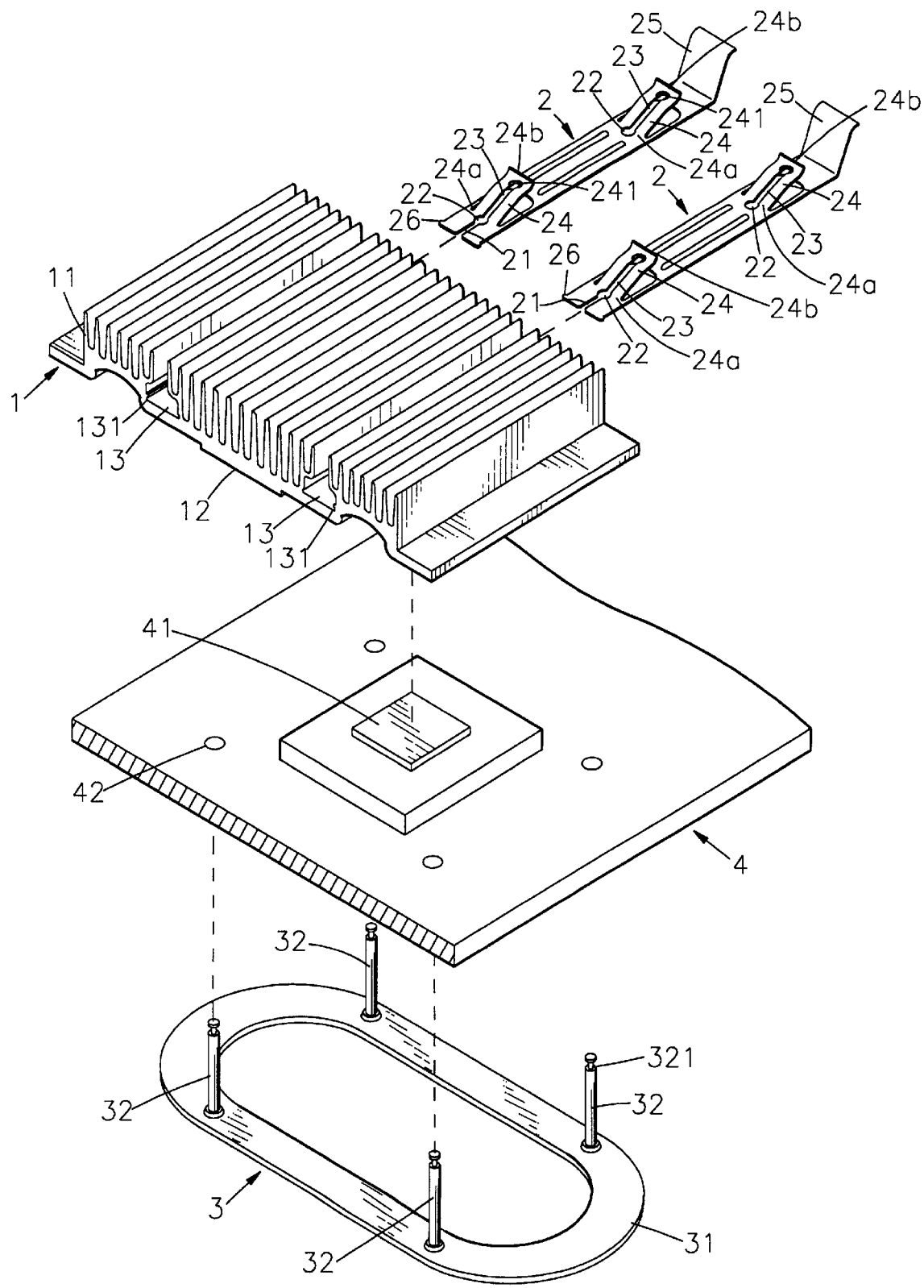
FIG. 1 is an exploded view of a CPU heat sink mounting arrangement according to the present invention.
Figure 2:
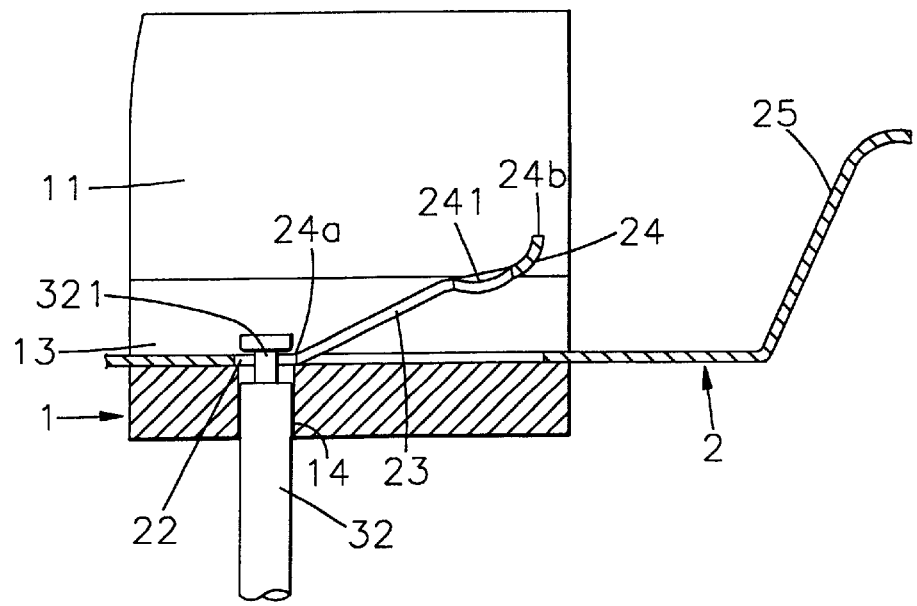
FIG. 2 is a sectional view of a part of the present invention, showing the locking plate coupled to the corresponding upright mounting rod (not locked).

Referring to FIGS. 1 and 2, the present invention has a heat sink 1, two locking plates 2, a positioning plate 3, and a circuit board 4.

Referring to FIG. 2 and FIG. 1 again, the heat sink 1 has a plurality of radiating fins 11, and two transverse paths 13 separated by the radiating fins 11, two sliding tracks 131 respectively defined in the transverse paths 13, two pairs of through holes 14 respectively provided at the transverse paths 13 near two opposite ends, and a flat bottom contact wall 12 at its bottom side. The width of the sliding track 131 in each of the transverse paths 13 is slightly greater than that of the locking plates 2 so that the locating plates 2 can be moved back and forth in the respective sliding tracks 131. The circuit board 4 is connected between the heat sink 1 and the positioning plate 3, having a CPU 41 for example PENTIUM II mounted thereon, four through holes 42 spaced around the CPU 41 in four corners corresponding to the through holes 14 at the heat sink 1, and a substantially L-shaped insulative plastic shell (not shown) covered on the bottom side one lateral side edge thereof. The positioning plate 3 has a hollow oval base 31, and four upright mounting rods 32 perpendicularly raised from the hollow oval base 31 corresponding to the through holes 42 at the circuit board 4. The upright mounting rods 32 each have a neck 321 near the top. The locking plates 2 are elongated sheets of metal respectively fastened to the upright mounting rods 32 to lock the heat sink 1, the circuit board 4 and the positioning plate 3 together. The length of the locking plates 2 is longer than that of the paths 13 at the heat sink 1. Each of the locking plates 2 has a transversely extended locating portion 26 at one end, a finger strip 25 at an opposite end, two spring strips 24 obliquely upwardly raised from its top side wall between the locating portion 26 and the finger strip 25, two round holes 22 respectively disposed at the fixed end 24a of each of the spring strips 24, two locating recesses 241 respectively disposed at the free end 24b of each of the spring strips 24, two elongated sliding slots 23 respectively provided at the spring strips 24 and connected between the round holes 22 and the locating recesses 241, and a narrow, elongated end notch 21 longitudinally extended from the mid point of the locating portion 26 to the round hole 22 at the fixed end 24a of the adjacent spring strip 24. The length of the locating portion 26 is slightly longer than the width of the sliding track 131 in each of the paths 13.

Figure 3:
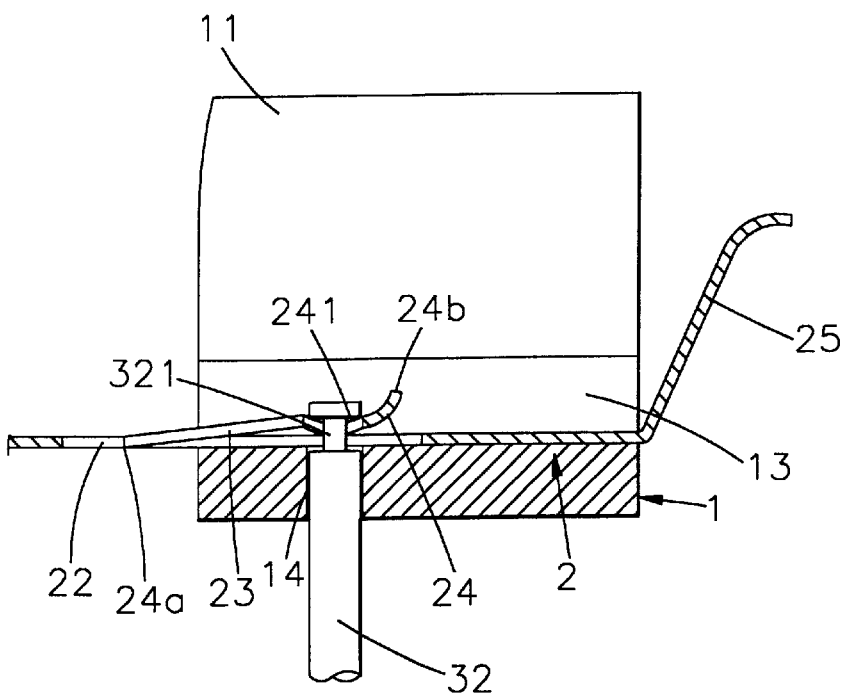
FIG. 3 is similar to FIG. 2 but showing the locking plate moved to the locked position.
Figure 4:
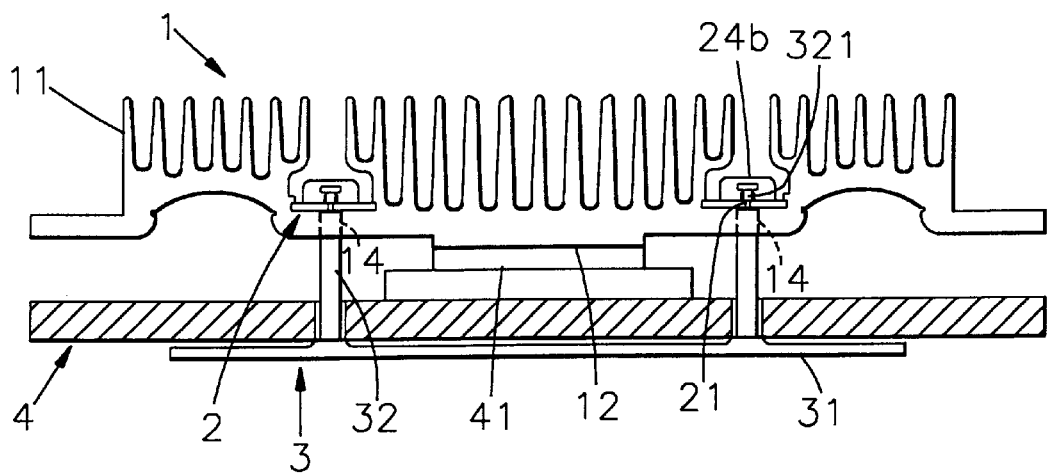
FIG. 4 is a front view in section of the present invention when locked.
Figure 5:
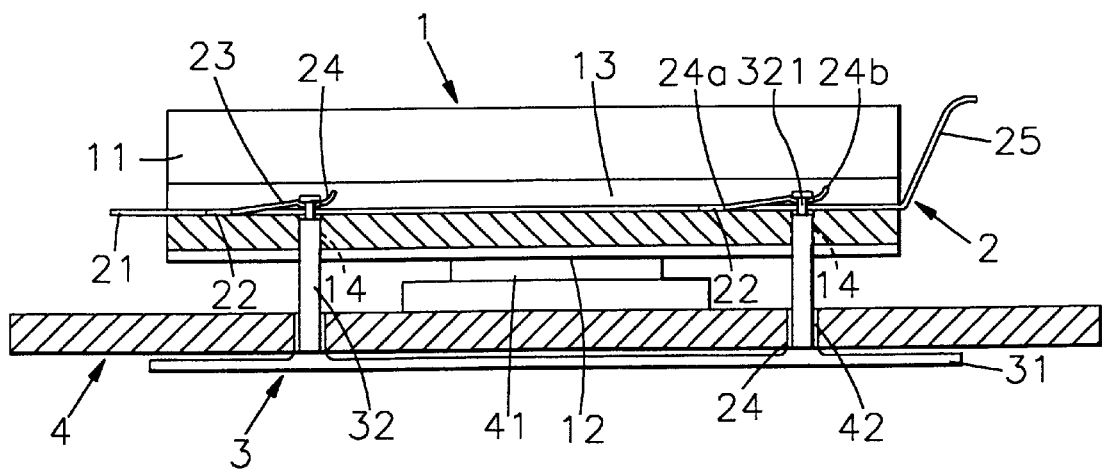
FIG. 5 is a side view of FIG. 4.

The installation procedure of the present invention is outlined hereinafter with reference to FIGS. 3 through 5 and FIGS. 1 and 2 again, the locating portion 26 of each of the locking plates 2 is respectively and axially squeezed inwards to close the respective narrow, elongated end notch 21 and then respectively inserted into the sliding track 131 in each of the paths 13 at the heat sink 1. After having passed through the sliding track 131 in each of the paths 13 of the heat sink 1, the locating portion 26 of each of the locking plates 2 respectively returns to its former shape and stopped at the radiating fins 11 at one end. When the locating portion 26 of each of the locking plates 2 is respectively stopped at the radiating fins 11 at one end, the round holes 22 are automatically maintained in alignment with the through holes 14 at the heat sink 1 for easy insertion of the upright mounting rods 32 of the positioning plate 3. After insertion of the locking plates 2 into the sliding track 131 at each of the paths 13 at the heat sink 1, the upright mounting rods 32 of the positioning plate 3 are respectively inserted through the through holes 42 at the circuit board 4, the through holes 14 at the heat sink 1, and the round holes 22 at the locking plates 2, and then the locking plates 2 are respectively pushed forwards, enabling the elongated sliding slots 23 to be moved with the respective locking plates 2 relative to the neck 321 of each of the upright mounting rods 32 of the positioning plate 3, and the locating recesses 241 at the locking plates 2 to be respectively forced into engagement with the neck 321 of each of the upright mounting rods 32 of the positioning plate 3. Through the finger strip 25 at each of the locking plates 2, the locking plates 2 can easily be moved into position. When installed, the flat bottom contact wall 12 of the heat sink 1 is maintained firmly in close contact with the surface of the CPU 41. Therefore, heat can be quickly transferred from the CPU 41 to the heat sink 1 during the operation of the CPU 41, and then dissipated into the air through the radiating fins 11 of the heat sink 1.

Because the round holes 22 at the locking plates 2 are automatically aligned with the through holes 14 at the heat sink 1 after the locating plates 2 have been respectively installed in the sliding track 131 at each of the paths 13, the installation of the present invention is easy. Because the positioning plate 3 has only a limited thickness, the present invention requires less installation space.

Figure 6:
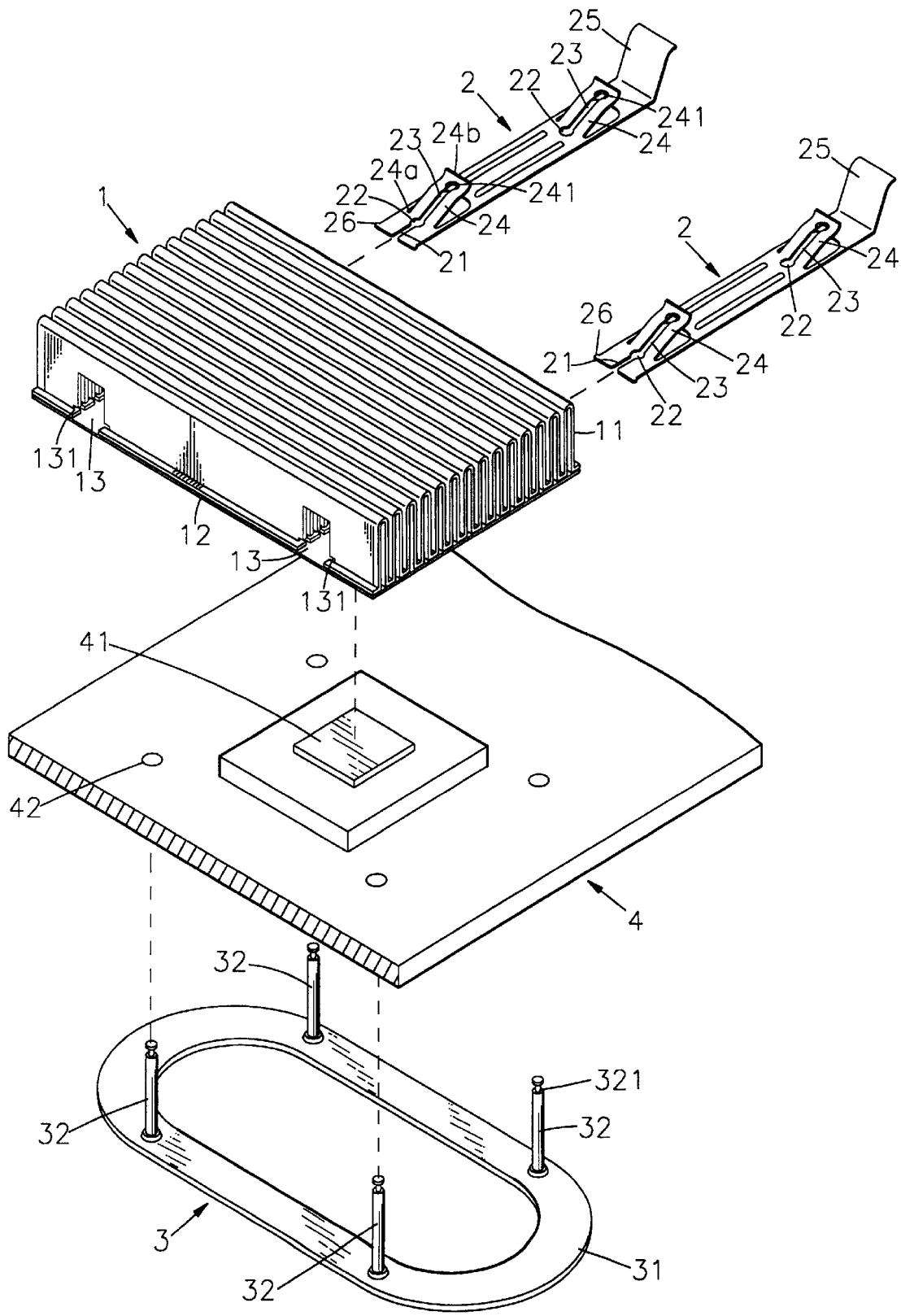
FIG. 6 is an exploded view of an alternate form of the present invention.

FIG. 6 shows an alternate form of the heat sink 1. According to this alternate form, the heat sink 1 has a heat conductive bottom contact wall 12, parallel radiating fins 11 formed of a thin sheet of aluminum alternatively bent up and down and fastened to the flat bottom contact wall 12, two parallel paths 13 transversely provided across the radiating fins 11 and defining a respective sliding track 131, and two pairs of through holes 42 respectively formed through the flat bottom contact wall 12 in communication with the sliding track 131 in each of the paths 13.

Figure 7:
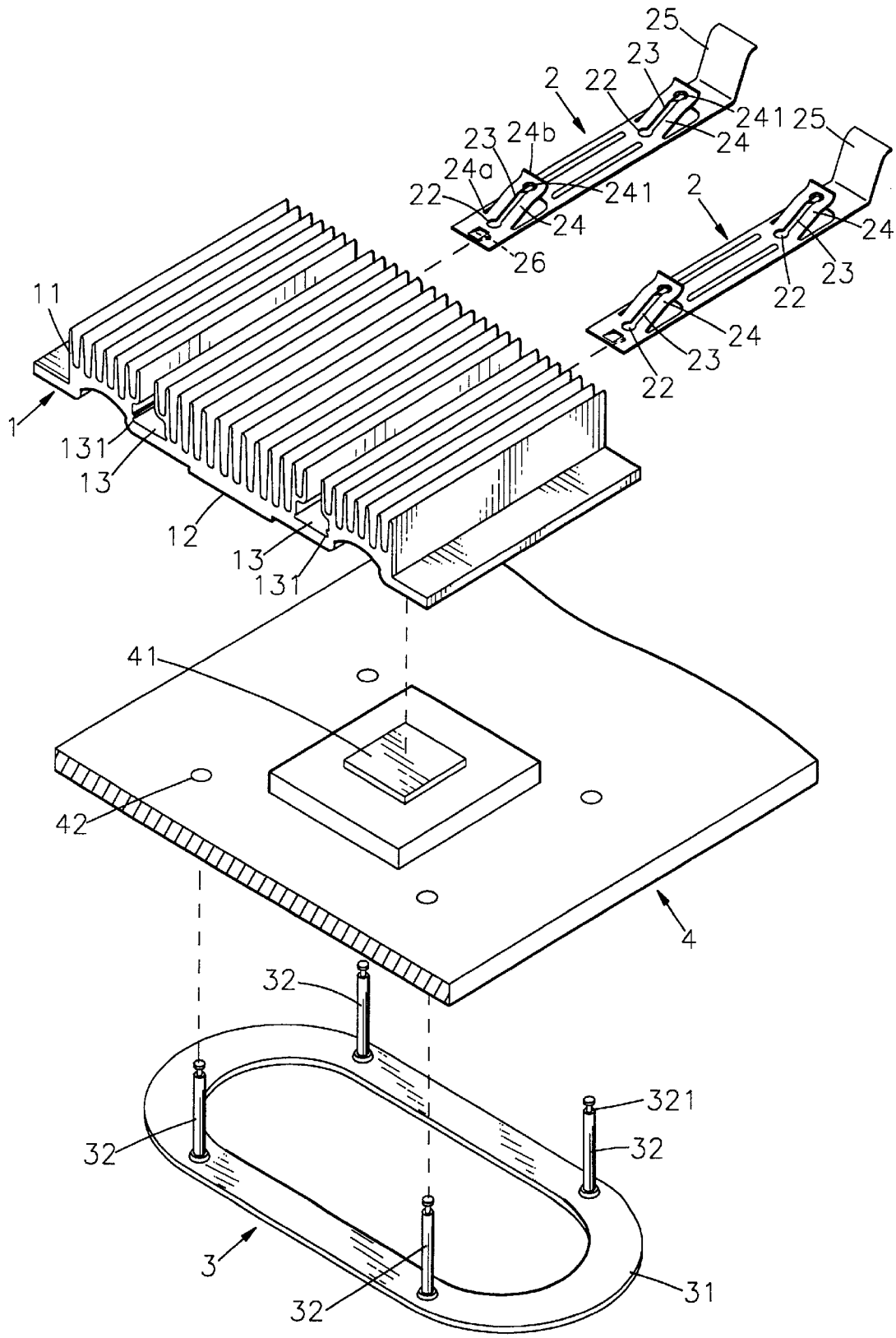
FIG. 7 is an exploded view of another alternate form of the present invention.
Figure 8:
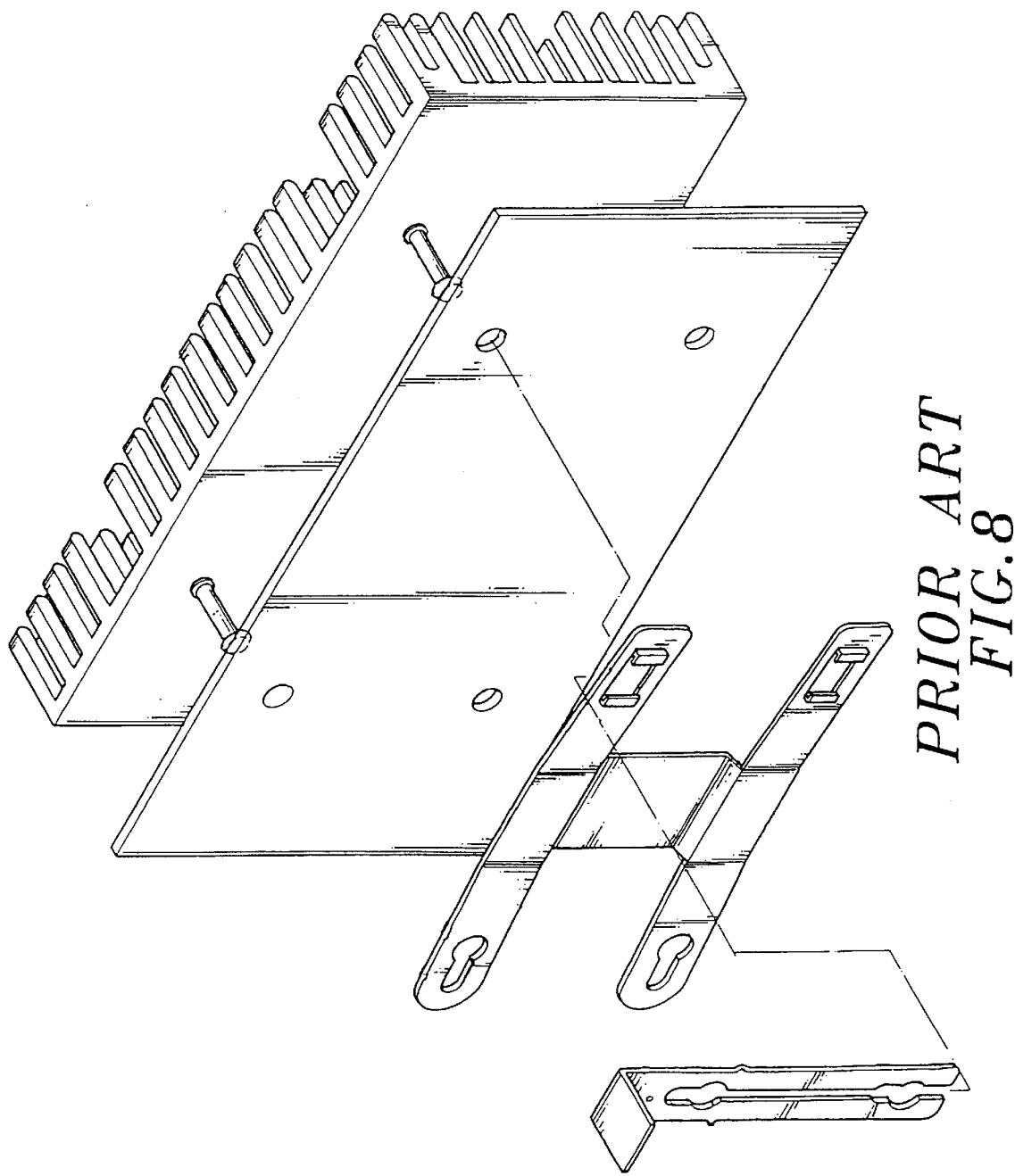
FIG. 8 is an exploded view of a cpu heat sink mounting arrangement according to prior art.

FIG. 7 shows an alternate form of the locking plate 2. According to this alternate form, the locating portion 26 is a hook formed integral with one end of the locking plate 2 on the middle remote from the finger strip 25. This alternate form eliminates the aforesaid narrow, elongated end notch 21. When the locking plate 2 is positioned on the sliding track 131 in one path 13 at the heat sink 1, the hook 26 is hooked on the bottom edge of the flat bottom contact wall 12 of the heat sink 1.

It is to be understood that the drawings are designed for purposes of illustration only, and are not intended as a definition of the limits and scope of the invention disclosed. For example, the finger strips 25 of the locking plates 2 may be formed integral with each other and connected in parallel.

What the invention claimed is:

1. A central processing unit (CPU) heat sink mounting arrangement, comprising:

a circuit board having a central processing unit, said circuit board having four first holes spaced around said central processing unit;

a heat sink mounted on a top side of said circuit board and maintained in contact with said central processing unit, said beat sink comprising a plurality of radiating fins raised from a bottom wall of said heat sink, two sliding tracks arranged in parallel at a top side of said heat sink, and four second holes in said sliding tracks through said bottom wall and corresponding to the first holes in said circuit board;

a positioning plate having a top side attached to a bottom side of said circuit board, said positioning plate comprising four upright mounting rods respectively inserted through the first holes in said circuit board and the second holes in said heat sink, each one of said upright mounting rods having a free end remote from said positioning plate and a neck near the respective free end; and two locking plates respectively mounted in said sliding tracks of said heat sink and fastened to said upright mounting rods of said positioning plate to lock said heat sink, said central processing unit and said positioning plate together;

each one of said locking plates comprising a locator formed on one end, said locator being forced into engagement with one end of any one of said sliding tracks of said heat sink, a finger manipulatable strip at an opposite end of said locking plates accommodating manual manipulation by a finger of a user, two spring strips obliquely upwardly raised from a top side wall of each one of said locking plates and spaced between said locator and said finger manipulatable strip, said spring strips each having a fixed end formed integral with the respective locking plate and a free end, a third hole disposed in the fixed end of each one of said spring strips, the third hole being aligned with one of the second holes in said heat sink accommodating insertion of the corresponding upright rod of said positioning plate when said locator is fastened to said heat sink, and each one of said spring strips having an elongated sliding slot, the elongated sliding slot extending from the third hole toward the free end of each one of said spring strips, the elongated sliding slot removably engaging the neck of a corresponding upright mounting rod of said positioning plate as each free end is moved toward a corresponding upright mounting rod.

2. The central processing unit (CPU) heat sink mounting arrangement of claim 1, each one of the spring strips of each one of said locking plates comprises a locating recess at the respective free end around one end of the respective elongated sliding slot.

3. The central processing unit (CPU) heat sink mounting arrangement of claim 1, each one of the spring strips of each one of said locking plates comprises a narrow, elongated end notch longitudinally extended from the mid point of the respective locator to the third hole of the fixed end of the adjacent spring strip.

4. The central processing unit (CPU) heat sink mounting arrangement of claim 1, the finger manipulatable strips of each one of said locking plates being integrally formed and parallel with the corresponding locking plate.

5. The central processing unit (CPU) heat sink mounting arrangement of claim 1, the locator of each one of said locking plates is a hook fastening on a bottom edge of said heat sink.

6. The central processing unit (CPU) heat sink mounting arrangement of claim 1, said radiating fins of said heat sink being formed of a sheet of aluminum alternatively bent up and down.

7. The central processing unit (CPU) heat sink mounting arrangement of claim 6, the two sliding tracks being provided transversely across said top side and between said radiating fins.

8. The central processing unit (CPU) heat sink mounting arrangement of claim 1, further comprised of said locator having a width longer than a distance between the two sliding tacks.

9. The central processing unit (CPU) heat sink mounting arrangement of claim 1, further comprised of a length of said locking plates being longer than a length of the two sliding tracks of said heat sink.

10. An apparatus, comprising:
  a circuit board having a central processing unit, said circuit board having a plurality of first holes spaced around said central processing unit;
  a heat sink mounted on a top side of said circuit board and maintained in contact with said central processing unit, said heat sink comprising a plurality of radiating fins raised from a bottom wall of said heat sink, said bottom wall being flat, a sliding track arranged on a top side of said heat sink, and a plurality of second holes in said sliding track through said bottom wall being in spatial correspondence with the first holes;
  a positioning plate having a top side attached to a bottom side of said circuit board, said positioning plate comprising a plurality of rods respectively inserted through the first holes in said circuit board and the second holes in said heat sink, each one of said rods having a neck portion of reduced cross-sectional diameter located between a head portion and a bottom portion of said rods, said rods being perpendicular with the top side of said positioning plate; and
  a locking plate mounted in said sliding track of said heat sink and removably engaging several of said rods of said positioning plate to lock said heat sink, said central processing unit, and said positioning plate together, said locking plate comprising a locator formed on one end, said locator being forced into engagement with one end of said sliding track, a finger manipulatable strip at an opposite end of said locking plate accommodating manual manipulation by a finger of a user, a plurality of spring strips raised obliquely in all upward direction from a top side wall of said locking plate and spaced between said locator and said finger manipulatable strip, said spring strips each having a fixed end formed integral with said locking plate and a free end, a third hole disposed in the fixed end of each one of said spring strips, the third hole being aligned with one of the second holes said heat sink accommodating insertion of the corresponding rod of said positioning plate when said locator is fastened to said heat sink each one of said spring strips having an elongated sliding slot, the slot extending from the third hole toward the free end of each one of said spring strips, the slot having a recessed portion disposed on one end of the slot towards the free end of each one of said spring strips, the slot engaging the neck of a corresponding rod of said positioning plate as each free end is moved toward the corresponding rod.

11. The apparatus of claim 10, wherein each one of the spring strips comprises a narrow, elongated end notch longitudinally extended from the midpoint of the respective locator to the third hole in the fixed end of the adjacent spring strip.

12. The apparatus of claim 10, with the finger manipulatable strip of said locking plate being integrally formed and parallel with the corresponding locking plate.

13. The apparatus of claim 10, with the locator of said locking plate being a hook fastening on a bottom edge of said heat sink.

14. The apparatus of claim 10, with said radiating fins of said heat sink being formed of a sheet of aluminum alternatively bent up and down.

15. The apparatus of claim 14, with the sliding track being provided transversely across said radiating fins.

16. The apparatus of claim 10, with said locator having a width longer than a distance between the sliding track.

17. The apparatus of claim 10, with a length of said locking plate being longer than a length of the sliding track of said heat sink.

18. A method, comprising the steps of:
  squeezing inwardly along an axis of a locating portion of a locking plate, said locating portion formed at one end of said locking plate and a finger manipulatable strip formed at an opposite end of said locking plate, an end notch formed between the width of said locating portion accommodating the squeezing of said locking plate, said finger manipulatable strip accommodating manual manipulation by a finger of a user, a spring strip raised obliquely upwardly from a top side wall of said locking plate and spaced between said locating portion and said finger manipulatable strip, said spring strip having a fixed end formed integral with the respective locking plate and a free end, a first hole disposed in the fixed end of said spring strip, the first hole being aligned with a second hole of said heat sink accommodating insertion of the corresponding upright rod of said positioning plate when said locating portion is fastened to said heat sink, said spring strip having an elongated sliding slot, said elongated sliding slot having a recessed portion disposed on one end of the elongated sliding slot towards the free end of said spring strip, the elongated sliding slot extending from the first hole to the recessed portion;
  inserting said locating portion of said locking plate into a first side of a sliding track of a heat sink, the sliding track formed along a surface of said heat sink, said heat sink having a plurality of radiating fins raised from a bottom wall of said heat sink;
  passing the locating portion of said locking plate through to a second side of the sliding track, said locking plate securing said locking plate with said heat sink when said locking plate returns to an unsqueezed position;
  aligning automatically a first hole in said locking plate with a second hole in said heat sink when said locating portion is stopped at the second side of the sliding track;
  aligning a third hole in a circuit board having a central processing unit with the second hole in said heat sink;

inserting a rod formed on a positioning plate through the third hole in said circuit board, the second hole in said heat sink, and the first hole in said locking plate, said rod having a neck portion of reduced cross-sectional diameter located between a head portion at one end of said rod and a free portion at an opposite end of said rod; and engaging the neck portion of said rod with said locking plate by moving the neck of said rod from the third hole to the recessed portion of the elongated sliding slot.

19. The method of claim 18, with the locating portion of said locking plate being a hook fastening on a bottom edge of said heat sink.

20. The method of claim 18, with said radiating fins of said heat sink being formed of a sheet of aluminum alternatively bent up and down and the sliding track being provided transversely across said radiating fins.

\* \* \* \* \*